(12) United States Patent
Felder et al.

(10) Patent No.: US 11,128,094 B2
(45) Date of Patent: Sep. 21, 2021

(54) PIN ENCODED MODE SELECTION SYSTEM

(71) Applicant: Maxim Integrated Products, Inc., San Jose, CA (US)

(72) Inventors: Matthew Derrell Felder, Austin, TX (US); Jeffrey Lee Lo, Sunnyvale, CA (US); Douglas Edward Heineman, Austin, TX (US)

(73) Assignee: MAXIM INTEGRATED PRODUCTS, INC., San Jose, CA (US)

( * ) Notice: Subject to any disclaimer, the term of this patent is extended or adjusted under 35 U.S.C. 154(b) by 88 days.

(21) Appl. No.: 16/556,761

(22) Filed: Aug. 30, 2019

(65) Prior Publication Data

US 2020/0106224 A1  Apr. 2, 2020

Related U.S. Application Data

(60) Provisional application No. 62/739,135, filed on Sep. 28, 2018.

(51) Int. Cl.
*H01R 24/28* (2011.01)
*G06F 3/16* (2006.01)
*H03M 1/66* (2006.01)

(52) U.S. Cl.
CPC ............ *H01R 24/28* (2013.01); *G06F 3/162* (2013.01); *H03M 1/66* (2013.01)

(58) Field of Classification Search
CPC ......... H01R 24/20; H01R 24/28; G06F 3/162; H03M 1/66

USPC .......................................... 381/120, 123, 124
See application file for complete search history.

(56) References Cited

U.S. PATENT DOCUMENTS

| | | | | |
|---|---|---|---|---|
| 6,212,199 B1 * | 4/2001 | Oxford | ...................... | G06F 3/16 370/466 |
| 7,299,444 B1 * | 11/2007 | Tai | ......................... | G06F 30/394 716/117 |
| 9,094,767 B2 * | 7/2015 | Lafky | .................. | H04R 29/001 |
| 9,461,601 B2 | 10/2016 | Felder | | |
| 2003/0093598 A1 * | 5/2003 | Park | .................. | H04M 1/72409 710/63 |
| 2014/0341398 A1 * | 11/2014 | Felder | ....................... | H03F 3/20 381/120 |

* cited by examiner

*Primary Examiner* — William A Jerez Lora
(74) *Attorney, Agent, or Firm* — Robert Crownover (57) ABSTRACT

A method and apparatus can include: audio interface pins coupled to swappable connections including a BCLK, an LRCLK, a DIN, and a DOUT; a BCLK determiner configured to identify the BCLK as the swappable connection with a highest frequency; an LRCLK determiner configured to: measure cycle lengths, compare the cycle lengths to a pre-defined multiple, identify the LRCLK as the swappable connections, and output an association between the LRCLK and one of the audio interface pins; and a mode determiner configured to identify and output a mode based on the association of the BCLK to the audio interface pins and the association of the LRCLK to the audio interface pins.

24 Claims, 6 Drawing Sheets

PIN ENCODED MODE SELECTION SYSTEM

CROSS-REFERENCE TO RELATED APPLICATION(S)

This claims priority benefit to all common subject matter of U.S. Provisional Patent Application No. 62/739,135 filed Sep. 28, 2018. The content of this application, in its entirety, is incorporated herein by reference.

TECHNICAL FIELD

This disclosure relates to mode encoding, more particularly to utilizing digital audio input pins for encoding mode information for audio amplifiers and digital to analog converters.

BACKGROUND

The rapid rise of wireless portable electronics devices, like cellular phones, laptop computers, and wearable devices has given rise to an insatiable demand for electronic components exhibiting lower cost, lower circuitry overhead, and greater functionality. This demand is acutely felt in portable, miniaturized, and wearable technologies where the input-output pins, of the electronic component, are limited.

Audio amplification technologies have unique attributes resulting in significant impacts on their architectural design, in that they must be highly miniaturized, provide and allow for enhanced functionality, maintain excellent linearity and noise characteristics, while simultaneously exhibit ultra-low power consumption. As an extension of the semiconductor industry, the audio amplification industry has witnessed ever-increasing commercial competitive pressures, along with growing consumer expectations and diminishing opportunities for meaningful product differentiation in the marketplace.

Component functionality is at the very core of next generation audio amplification insertion strategies outlined in road maps for development of next generation audio amplifiers. Competitive next generation drivers should increase signal to noise ratio, decrease costs, while providing greater and more accessible functionality. Importantly, for some industry segments including class-D audio amplifiers, achieving greater functionality and functionality control is critical.

Industry road maps have identified significant gaps between the current audio amplifier capability and demand for ultra-functional, low cost, and low power solutions. For example, some current electronic components are so "pin-constrained" that the components do not have enough pins to even include mode control pin inputs for supporting standard communications protocol such as I2C or SPI.

In such instances, the full component functionality may only be accessible through costly, bulky, or power hungry additional circuitry. In one illustrative example, some current class-D amplifiers rely on a selectable external series resistor used with the input-output pins. This is undesirable due to the need for external components and special analog detection circuitry.

Solutions have been long sought but prior developments have not taught or suggested any complete solutions, and solutions to these problems have long eluded those skilled in the art. Thus, there remains a considerable need for miniaturized audio driver systems that maintain excellent linearity and noise characteristics while greatly expanding functionality and control.

BRIEF DESCRIPTION OF THE DRAWINGS

The selection system is illustrated in the figures of the accompanying drawings which are meant to be exemplary and not limiting, in which like reference numerals are intended to refer to like components, and in which.

DETAILED DESCRIPTION

In the following description, reference is made to the accompanying drawings that form a part hereof, and in which are shown by way of illustration, embodiments in which the selection system may be practiced. It is to be understood that other embodiments may be utilized and structural changes may be made without departing from the scope of the selection system.

When features, aspects, or embodiments of the selection system are described in terms of steps of a process, an operation, a control flow, or a flow chart, it is to be understood that the steps can be combined, performed in a different order, deleted, or include additional steps without departing from the selection system as described herein.

The selection system is described in sufficient detail to enable those skilled in the art to make and use the selection system and provide numerous specific details to give a thorough understanding of the selection system; however, it will be apparent that the selection system may be practiced without these specific details. In order to avoid obscuring the selection system, various digital component design and layout are not described in detail as those of ordinary skill in the art would be acquainted with the rich and vast technological library, which has steadily grown over more than forty years. Therefore, functions such as counting, storing, comparing are not shown at the discrete component level as these are considered to be mere reduction to practice of a fully enabled selection system. Further, specific discrete components and their layout are not considered to be pertinent to the selection system as described and claimed.

In order to avoid obscuring the selection system, some well-known system configurations and descriptions are not disclosed in detail. Likewise, the drawings showing embodiments of the system are semi-diagrammatic and not to scale and, particularly, some of the dimensions are for the clarity of presentation and are shown greatly exaggerated in the drawing FIGs.

For descriptive clarity, the selection system of the first and second embodiments are described in reliance on communication lines bit clock (BCLK), word clock or left and right clock (LRCLK), data input (DIN), and data output (DOUT) from the Inter-IC Sound standard (I2S standard) because it is commonly used in most digital audio systems. However, it is to be understood that other embodiments are contemplated and the selection system is not intended to be limited to the I2S standard.

For descriptive clarity, the selection system of the third embodiment is described in reliance on communication lines bit clock (BCLK) and data output (DOUT) as they are understood with regard to pulse density modulation (PDM); however, it is to be understood that other embodiments are contemplated and the selection system is not intended to be limited to PDM. As used herein the word "association" or "associations", as in "an association of pins" should be understood to mean a physical connection between associated elements, components, and parts.

Figure 1:
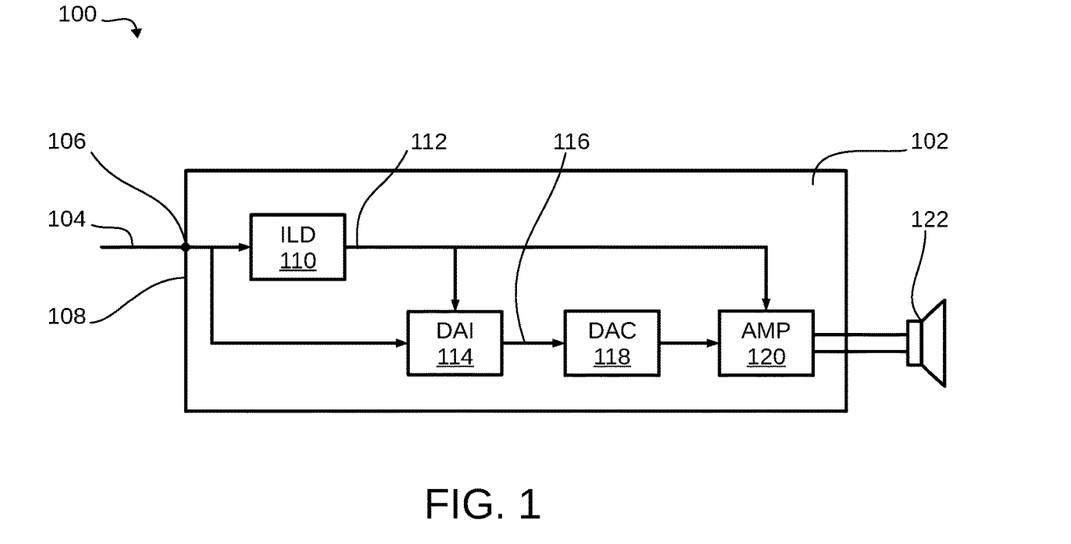
FIG. 1 is a block diagram of the selection system in a first embodiment.

Referring now to FIG. 1, therein is shown a block diagram of the mode selection system 100 in a first embodiment. The selection system 100 can include an audio device 102. The audio device 102 can function and include a digital to analog converter, an audio amplifier such as a class-D audio amplifier, or a combination thereof.

The audio device 102 can include swappable connections 104. The swappable connections 104 can be digital communication lines, which are described with greater detail with regard to FIG. 2. The swappable connections 104 can be physically coupled to audio interface pins 106.

The audio interface pins 106 can be in a fixed association relative to the audio device 102 and can be implemented as interconnect terminals such as ball bonds, exposed leads or traces formed on the audio device 102 and exposed from an external surface 108, thereof. The audio device 102 can include an interface location determiner 110. The interface location determiner 110 can determine which of the audio interface pins 106 are associated with which specific swappable connections 104.

The interface location determiner 110 can include a mode selection 112 as an output. It is additionally contemplated that the interface location determiner 110 can output a pin association identifying which of the swappable connections 104 are correlated with which audio interface pins 106.

The interface location determiner 110 can be coupled to a digital audio interface 114. The digital audio interface 114 can include the swappable connections 104 and the mode selection 112 as inputs. The digital audio interface 114 can output digital data associated with an assigned channel. That is, the digital audio interface 114 can pull out the individual channels of the DIN swappable connection 104 to multiple output channels 116.

The output channels 116 of the digital audio interface 114 can be coupled to a digital to analog converter 118. The digital to analog converter 118 can convert the digital data from each of the output channels 116 of the digital audio interface 114 to analog signals for each of the output channels 116. The analog signal can be output from the digital to analog converter 118 to an amplifier 120.

In some contemplated embodiments, the amplifier 120 could be removed and the audio device 102 could function as a digital to analog converter with the mode selection provided by way of the interface location determiner 110 and initiated based on the mode selection 112. In such alternative embodiments it is contemplated that the digital data input could have a pulse-code modulation scheme. It is further contemplated that in such alternative embodiments the output lines of the digital to analog converter 118 could be exposed from the external surface 108 of the audio device 102.

The amplifier 120 can receive the analog signals output from the digital to analog converter 118 and amplify the analog signals. The amplifier 120 is shown coupled to the mode selection 112 output of the interface location determiner 110. It is contemplated that the mode determined by the interface location determiner 110 and output on the mode selection 112 can be used to identify an amplifier gain, amplifier volume ramping, filtering schemes, or a combination thereof. All of which can be applied, to the analog inputs received from the digital to analog converter 118, within the amplifier 120.

It is alternatively contemplated that the filtering type selected by the mode selection 112 could be performed by additional circuitry or logic outside of the amplifier 120 and controlled by the mode selection 112. The amplifier 120 can output audio signals from the audio device 102 to speakers 122.

The modes, selectable by way of encoding the swappable connections 104, can direct the operation of the audio device 102 in many ways. For example, the modes could indicate gain settings, digital audio interface data format, channel selections, and filter settings for the audio device 102 of FIG. 1. The gain settings could include selectable gain settings such as gains of 3 dB, 6 dB, 9 dB, 12 dB, and 15 dB.

The digital audio interface data format could include I2S standard, left justified, right justified, and time division multiplexing (TDM). The channel selections could include one or more channels selected from channel 0-8 of the output channels 116, left, right, mono-mix, or other TDM channel. It is further contemplated that the modes of the third class of pin associations could indicate a combination of gain settings, digital audio interface settings, channel selections, and filter settings.

Figure 2:
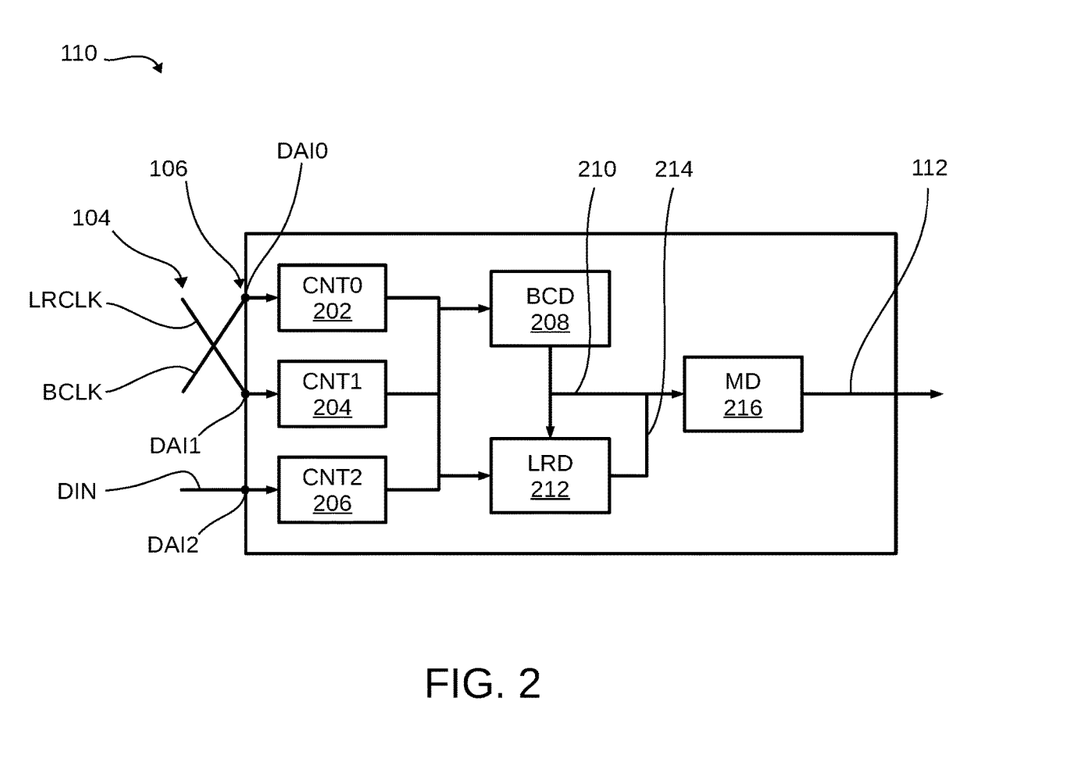
FIG. 2 is a block diagram of the interface location determiner for the selection system of FIG. 1.

Referring now to FIG. 2, therein is shown a block diagram of the interface location determiner 110 for the selection system 100 of FIG. 1. The interface location determiner 110 can include the audio interface pins 106 in a fixed association relative to components within the interface location determiner 110 such as counters.

Illustratively, by way of example, the audio interface pins 106 can include a first Digital Audio Interface pin (DAI0) coupled to a first counter (CNT0 202), a second Digital Audio Interface pin (DAI1) coupled to a second counter (CNT1 204), and a third Digital Audio Interface pin (DAI2) coupled to a third counter (CNT2 206).

The swappable connections 104 are depicted as coupled to the audio interface pins 106. For descriptive clarity, the swappable connections 104 will be described with regard to an LRCLK, a BCLK, and a DIN which should be understood in light of the I2S Inter-IC Sound standard.

As will be appreciated by those of ordinary skill in the art, LRCLK, BCLK, and DIN inputs are used to aid the descriptive illustration of the selection system 100 as they are commonly understood and used with regard to audio amplifiers. However, unless explicitly claimed, no limitation of claimed scope to an I2S implementation should be implied based on the usage of the labels LRCLK, BCLK, and DIN.

For the purposes of this application, the LRCLK should be understood to be a channel sync signal. In I2S, the channel sync signal is analogous to the LRCLK, however it is understood by those of ordinary skill in the art that there are other types of channel sync signals that can be used in other contemplated embodiments, and which are referred to herein by the LRCLK. That is, the LRCLK will be used to refer to a channel sync signal in a TDM mode, even though the channel sync signal of TDM is not a left/right sync signal.

The LRCLK can therefore refer to a word clock line, a word select, a channel sync, or left-right clock. The BCLK can refer to a bit clock while the DIN can refer to a shared data line for multiple channels of data.

Each channel of data can be multiplexed into sequential data frames within the DIN and each frame of data is synchronized with the LRCLK signal. The LRCLK can be a known multiple of the BCLK. For example, the LRCLK can be 48, 64, 128, or 256 cycles of the BCLK. It is contemplated that the LRCLK could be higher multiples of the BCLK.

As depicted in FIG. 2, the swappable connections 104 are connected to the audio interface pins 106 in a MODE 0 configuration as described below with regard to FIGS. 4 and 5. Alternatively, the audio interface pins 106 can also be associated to indicate a MODE 1 of FIG. 3. Specifically, the LRCLK is connected to the DAI1, the BCLK is connected to the DAI0, and the DIN is connected to the DAI2.

The counters can first count the digital cycles or pulses of the swappable connections 104. Illustratively, the CNT0 202 can count the BCLK cycles, the CNT1 204 can count the LRCLK cycles, and the CNT2 206 can count the DIN cycles, for example.

The output count of the counters can be input into a BCLK determiner 208. The BCLK determiner 208 can function in multiple different ways. One contemplated method can include identifying the swappable connection 104 with the highest count or highest frequency. Another contemplated method can include identifying the swappable connection 104 with the highest frequency that is also over a minimum BCLK threshold. Yet a further contemplated embodiment can include identifying the swappable connection 104 with the highest frequency and that matches a known BCLK frequency.

It is further contemplated that the BCLK determiner 208 can implement the largest count determination along with the minimum BCLK threshold and along with the BCLK frequency match in order to qualify and determine which of the swappable connections 104 corresponds to the BCLK. Once one of the swappable connections 104 is found to have a highest frequency, be above a minimum BCLK threshold, match a known BCLK frequency, or a combination thereof, the BCLK determiner 208 can output a qualified BCLK line 210.

The qualified BCLK line 210 can indicate which of the swappable connections 104 correspond to the BCLK and which of the audio interface pins 106 is connected to the BCLK. The output of the counters along with the qualified BCLK line 210 can be input into an LRCLK determiner 212.

Because the BCLK is known via the qualified BCLK line 210, the LRCLK determiner 212 can compare the other two swappable connections 104 to the qualified BCLK line 210. The cycle length of the other two swappable connections 104 can be compared with the BCLK in order to determine which of the remaining two swappable connections 104 is the LRCLK.

When the length of one cycle from one of the remaining two swappable connections 104 is determined to be a predefined multiple of the BCLK, the LRCLK determiner 212 will output a qualified LRCLK line 214 identifying which of the swappable connections 104 is the LRCLK and which of the audio interface pins 106 is connected to the LRCLK.

The lengths of the remaining two swappable connections 104 can be measured by the BCLK and the result compared to known multiples stored in registers. For example, if the LRCLK determiner 212 found one of the swappable connections 104 to have a cycle with a length of 256 BCLK cycles, the LRCLK determiner 212 would compare the length with registers containing 48, 64, 128, and 256, for example. Since the length of the swappable connection 104 matches with one of the registers, the LRCLK determiner 212 can qualify the LRCLK and output the qualified LRCLK line 214.

The interface location determiner 110 can, by process of elimination, determine that the remaining swappable connection 104 corresponds to the DIN and which of the audio interface pins 106 the DIN is connected to. It is contemplated that the DIN could also be qualified since DIN data is clocked in by BCLK, its frequency is never more than half that of BCLK.

The length of the DIN line could be compared to the BCLK to ensure the DIN is no more than half the frequency of the BCLK and thereby qualify the DIN. It is contemplated that the swappable connections 104 can be qualified based on multiple readings to increase the robustness of identification as will be discussed with regard to FIG. 6.

The qualified LRCLK line 214 and the qualified BCLK line 210 can be received by a mode determiner 216. The mode determiner 216 can correlate the associations of the swappable connections 104 relative to the audio interface pins 106 with a mode for operating the selection system 100.

The mode determiner 216 can utilize a lookup table containing associations of the swappable connections 104 relative to the audio interface pins 106 correlated to modes, or utilize digital logic. The output of the mode determiner 216 is the mode selection 112 which can be indicative of MODE 0, or MODE 1 of FIG. 4, can be indicative of MODE 0, MODE 1, or MODE 2 of FIG. 5, or can be indicative of MODE 0, MODE 1, MODE 2, MODE 3, MODE 4, or MODE 5 of FIG. 6.

Figure 3:
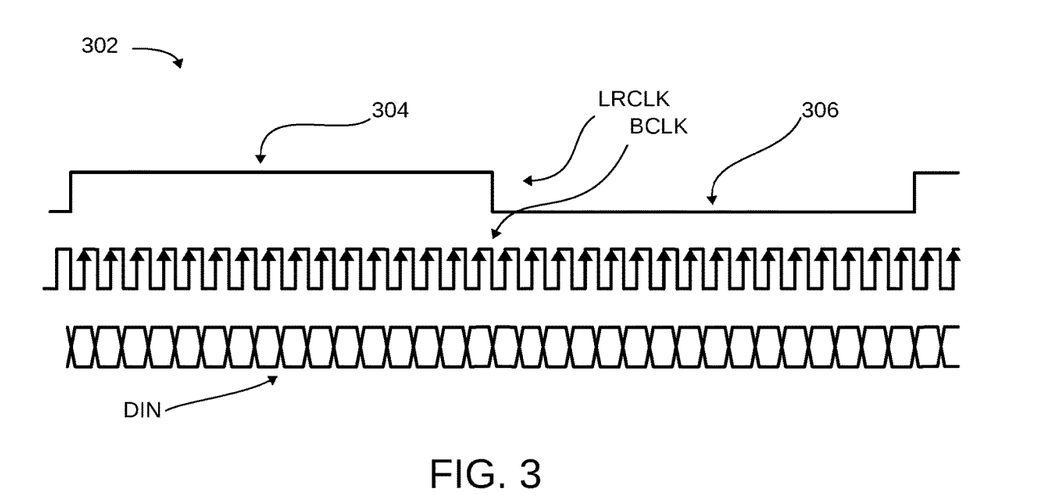
FIG. 3 is a timing diagram for the selection system of FIG. 1.

Referring now to FIG. 3, therein is shown a timing diagram 302 for the selection system 100 of FIG. 1. Illustratively, the timing diagram 302 can depict the LRCLK, BCLK and DIN signals.

As will be appreciated, BCLK frequency is always at least twice the frequency of DIN or LRCLK. The BCLK frequency is one of several fixed multiples of LRCLK frequency. And, the DIN data is clocked in by BCLK, so its frequency is never more than half that of BCLK.

The LRCLK is further depicted with a left channel 304 and a right channel 306. The left channel 304 and the right channel 306 can also be understood to be a channel 0 and a channel 1, respectively. The data carried by the DIN can be mapped to one of the channels of the LRCLK based on the data being synchronized with the individual channels.

Figure 4:
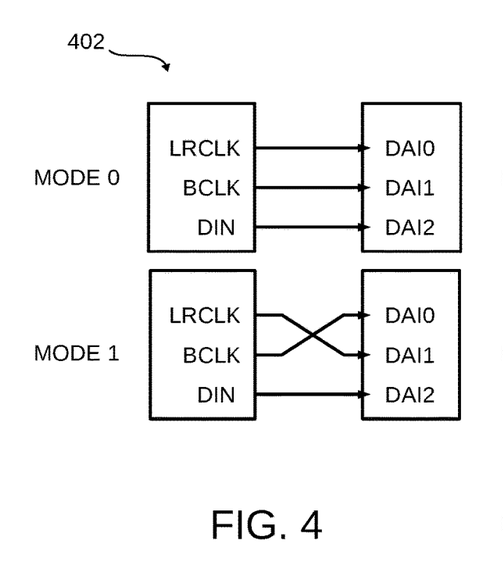
FIG. 4 is a pin association diagram for a first class of pin associations for the selection system of FIG. 1.

Referring now to FIG. 4, therein is shown a pin association diagram 402 for a first class of pin associations for the selection system 100 of FIG. 1. In this first class of pin associations, the audio device 102 of FIG. 1 can be configured having the DIN in a fixed association with regard to the audio interface pins 106 of FIG. 1.

This can be illustrated by the DIN being associated and connected with the DAI2 for both MODE 0 and MODE 1. While the DIN is described as a swappable connection, it is contemplated that, with regard to the first class of pin associations, that the DIN is limited in its connection to one specific audio interface pins, which is pre-determined.

The associations of the LRCLK and the BCLK can swap between the DAI0 and the DAI1 resulting in two possible modes. It has been discovered that the first class of pin associations, can function by minimally detecting the BCLK. Thus, the LRCLK determiner 212 of FIG. 2 can be disregarded because once the interface location determiner 110 of FIG. 1 determines the location of the BCLK, the LRCLK will be known; while DIN is known as it is in a fixed association.

It is contemplated that in the first class of pin associations, the MODE 0 and MODE 1 may indicate any two modes of operation. For example, left vs right channel or 6 dB gain vs 12 dB gain. Although the DIN is shown in a fixed association relative to the audio interface pins 106, the DIN should not be understood as associated solely with the DAI2, rather the DIN could be fixed relative to any of the audio interface pins 106.

Although the DIN is shown in a fixed association with the DAI2, other fixed associations are contemplated. Illustratively, it is contemplated that the BCLK or the LRCLK could be in a fixed association with one of the audio interface pins 106 while the remaining two connections remain swappable and can be assigned to all other audio interface pins 106.

Figure 5:
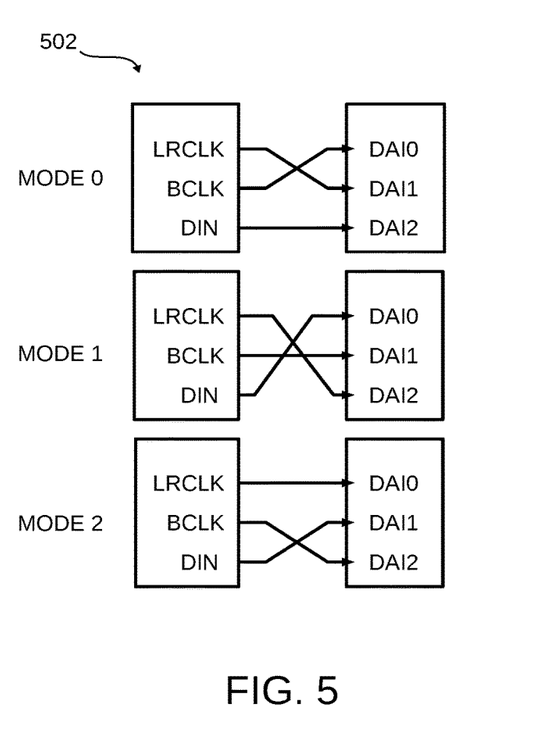
FIG. 5 is a pin association diagram for a second class of pin associations for the selection system of FIG. 1.

Referring now to FIG. 5, therein is shown a pin association diagram 502 for a second class of pin associations for the selection system 100 of FIG. 1. In the second class of pin associations, the audio device 102 of FIG. 1, can be configured limiting the swappable connections 104 of FIG. 1 to three associational permutations relative to the audio interface pins 106 of FIG. 1.

That is, the BCLK can be associated with the DAI0, the DAI1, or the DAI2. When the BCLK is associated with the DAI0, the LRCLK is limited to a connection with the DAI1 and the DIN is limited to a connection with the DAI2. When the BCLK is associated with the DAI1, the LRCLK is limited to a connection with the DAI2 and the DIN is limited to a connection with the DAI0. When the BCLK is associated with the DAI2, the LRCLK is limited to a connection with the DAI0 and the DIN is limited to a connection with the DAI1.

It is contemplated that other pre-defined relationships and location limitations could be used. For example, when the BCLK is associated with the DAI1, the LRCLK is limited to a connection with the DAI0 and the DIN is limited to a connection with the DAI2, for example.

It has been discovered that the second class of pin associations, limits the detection of the swappable connections 104 to a detection of the BCLK. Thus, the LRCLK determiner 212 of FIG. 2 can be disregarded because once the interface location determiner 110 of FIG. 1 determines the location of the BCLK, the LRCLK and the DIN will be known.

This can decrease time, complexity, circuitry overhead, and reliability of mode selection determination. Further, the second class of pin associations can provide three modes of operation along with simple, fast, and reliable detection.

Once the audio interface pin 106 with the fastest signal is identified, the associations of LRCLK and DIN are pre-defined. Further validation of the LRCLK and BCLK can be done to ensure robustness as discussed with regard to FIG. 2. Specifically, the number of BCLK per LRCLK can be counted to ensure valid LRCLK word length. Further, the frequency of the BCLK and the LRCLK can be checked to ensure they are known frequencies for the BCLK and the LRCLK. It is contemplated that the checks of LRCLK and BCLK can be completed before the data contained within the DIN and output on the output channels 116 of FIG. 1 is allowed to pass through to the amplifier 120 of FIG. 1.

Additionally, it is contemplated that additional number of LRCLK cycles can be monitored for validity with respect to the BCLK. For instance, the LRCLK determiner 212 can check eight cycles of the LRCLK before outputting the qualified LRCLK line 214 of FIG. 2. MODE 0, MODE 1, and MODE 2 can correlate to Left, Right, and Left+Right modes, respectively.

Figure 6:
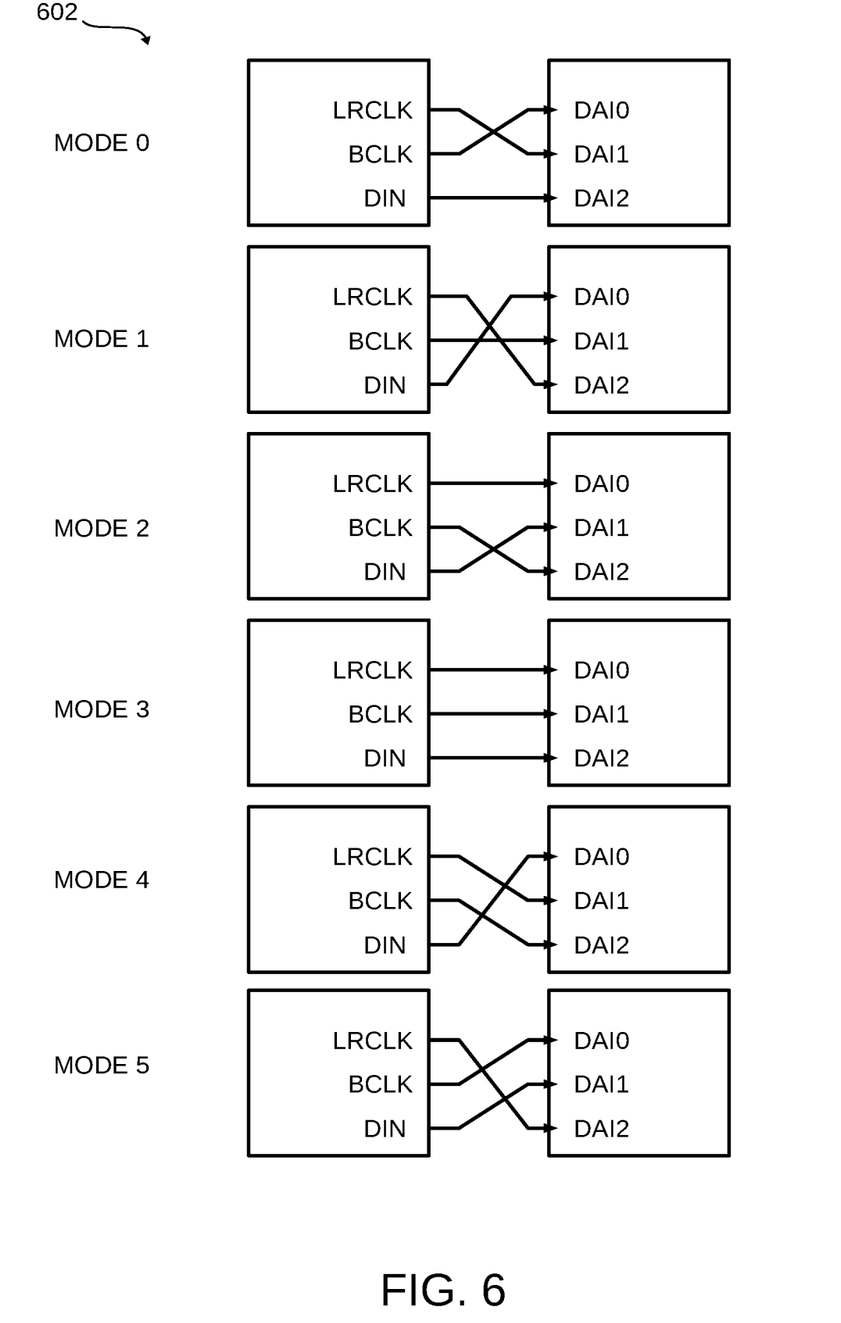
FIG. 6 is a pin association diagram for a third class of pin associations for the selection system of FIG. 1.

Referring now to FIG. 6, therein is shown a pin association diagram 602 for a third class of pin associations for the selection system 100 of FIG. 1. In the third class of pin associations, the audio device 102 of FIG. 1, can be configured without any predefined limitations on the associations of the swappable connections 104 of FIG. 1 relative to the audio interface pins 106 of FIG. 1. It is contemplated that the modes of the third class of pin associations could indicate gain settings, digital audio interface settings, channel selections, and filter settings for the audio device 102 of FIG. 1.

The gain settings could include selectable gain settings such as gains of 3 dB, 6 dB, 9 dB, 12 dB, and 15 dB. The digital audio interface settings could include left justified, right justified, and TDM. The channel selections could include channel 0-8 of the output channels 116 of FIG. 1, Left+Right, Left, or Right.

It is further contemplated that the modes of the third class of pin associations could indicate a combination of gain settings, digital audio interface settings, channel selections, and filter settings. Illustratively, the MODE 2 could indicate a fixed 12 dB gain in TDM mode, for example.

Figure 7:
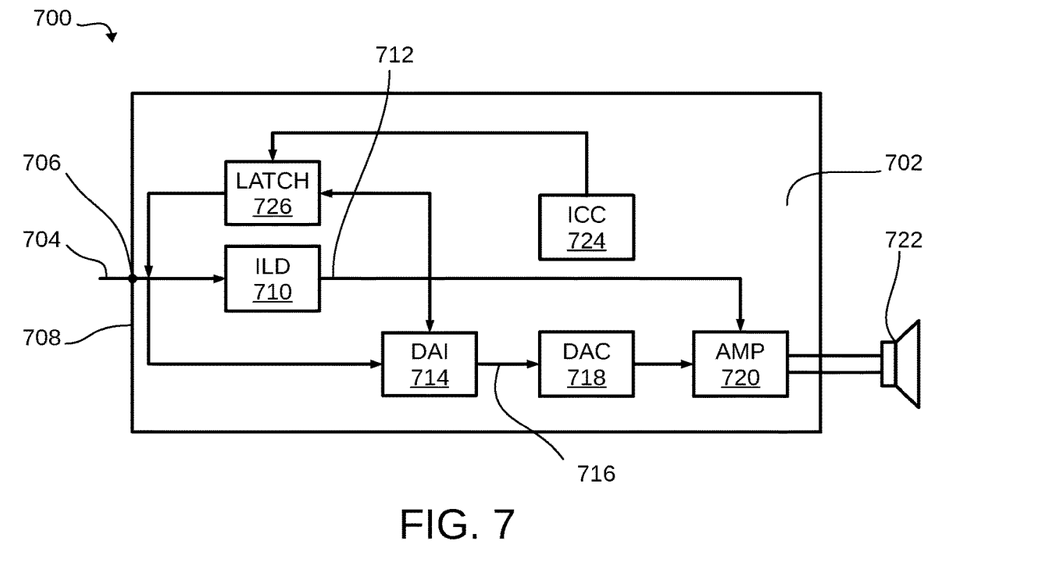
FIG. 7 is a block diagram of the selection system in a second embodiment.

Referring now to FIG. 7, therein is shown a block diagram of the selection system 700 in a second embodiment. The selection system 700 can include an audio device 702. The audio device 702 can function and include a digital to analog converter, an audio amplifier such as a class-D audio amplifier, or a combination thereof.

The audio device 702 can include swappable connections 704. The swappable connections 704 can be digital communication input and output lines, which are described with greater detail with regard to FIG. 8. The swappable connections 704 can be physically coupled to audio interface pins 706.

The audio interface pins 706 can be in a fixed association relative to the audio device 702 and can be implemented as interconnect terminals such as ball bonds, exposed leads or traces formed on the audio device 702 and exposed from an external surface 708, thereof. The audio device 702 can include an interface location determiner 710. The interface location determiner 710 can determine which of the audio interface pins 706 are associated with which specific swappable connections 704.

The interface location determiner 710 can include a mode selection 712 as an output. It is additionally contemplated that the interface location determiner 710 can output a pin association identifying which of the swappable connections 704 are correlated with which audio interface pins 706.

The interface location determiner 710 can be coupled to a digital audio interface 714. The digital audio interface 714 can include the swappable connections 704 and the mode selection 712 as inputs. The digital audio interface 714 can output digital data associated with an assigned channel. That is, the digital audio interface 714 can pull out the individual channels of the DIN swappable connection 704 to multiple output channels 716.

The output channels 716 of the digital audio interface 714 can be coupled to a digital to analog converter 718. The digital to analog converter 718 can convert the digital data from each of the output channels 716 of the digital audio interface 714 to analog signals for each of the output channels 716. The analog signal can be output from the digital to analog converter 718 to an amplifier 720.

In some contemplated embodiments, the amplifier 720 could be removed and the audio device 702 could function as a digital to analog converter with the mode selection provided by way of the interface location determiner 710 and initiated based on the mode selection 712. In such alternative embodiments it is contemplated that the digital data input could have a pulse-code modulation scheme. It is further contemplated that in such alternative embodiments the output lines of the digital to analog converter 718 could be exposed from the external surface 708 of the audio device 702.

The amplifier 720 can receive the analog signals output from the digital to analog converter 718 and amplify the analog signals. The amplifier 720 is shown coupled to the mode selection 712 output of the interface location determiner 710. It is contemplated that the mode determined by the interface location determiner 710 and output on the mode selection 712 can be used to identify an amplifier gain, amplifier volume ramping, filtering schemes, or a combination thereof. All of which can be applied, to the analog inputs received from the digital to analog converter 718, within the amplifier 720.

It is alternatively contemplated that the filtering type selected by the mode selection 712 could be performed by additional circuitry or logic outside of the amplifier 720 and controlled by the mode selection 712. The amplifier 720 can output audio signals from the audio device 702 to speakers 722.

The audio device 702 can further include an inter-chip communication bus 724. The inter-chip communication bus 724 can be coupled to a DOUT pin, which is one of the swappable connections 704. The inter-chip communication bus 724 can be coupled to the swappable connections 704 through a latch 726.

The latch 726 can be coupled to the output of the interface location determiner 710 and can receive the mode selection 712, the pin associations, or a combination thereof as inputs. The latch 726 can latch the inter-chip communication bus 724 with the audio interface pin 706 associated with DOUT.

It is contemplated that the latch 726 can use the pin association provided by the digital audio interface 714 to connect the inter-chip communication bus 724 to the DOUT. Alternatively, it is contemplated that the latch 726 could look up the pin associations between the audio interface pins 706 and the DOUT based on the mode selection 712, since each mode can correspond to an exact association of the swappable connections 704 with the audio interface pins 706.

Providing the inter-chip communication bus 724 coupled to the DOUT can, for example, facilitate synchronization between groups audio devices 702. For example, gain can be synchronized between multiple audio devices 702.

The modes, selectable by way of encoding the swappable connections 704, can direct the operation of the audio device 702 in many ways. For example, the modes could indicate gain settings, digital audio interface data format, channel selections, and filter settings for the audio device 702 of FIG. 7. The gain settings could include selectable gain settings such as gains of 3 dB, 6 dB, 9 dB, 12 dB, and 15 dB.

The digital audio interface data format could include I2S standard, left justified, right justified, and time division multiplexing (TDM). The channel selections could include one or more channels selected from channel 0-8 of the output channels 716, left, right, mono-mix, or other TDM channel. It is further contemplated that the modes of the third class of pin associations could indicate a combination of gain settings, digital audio interface settings, channel selections, and filter settings.

Figure 8:
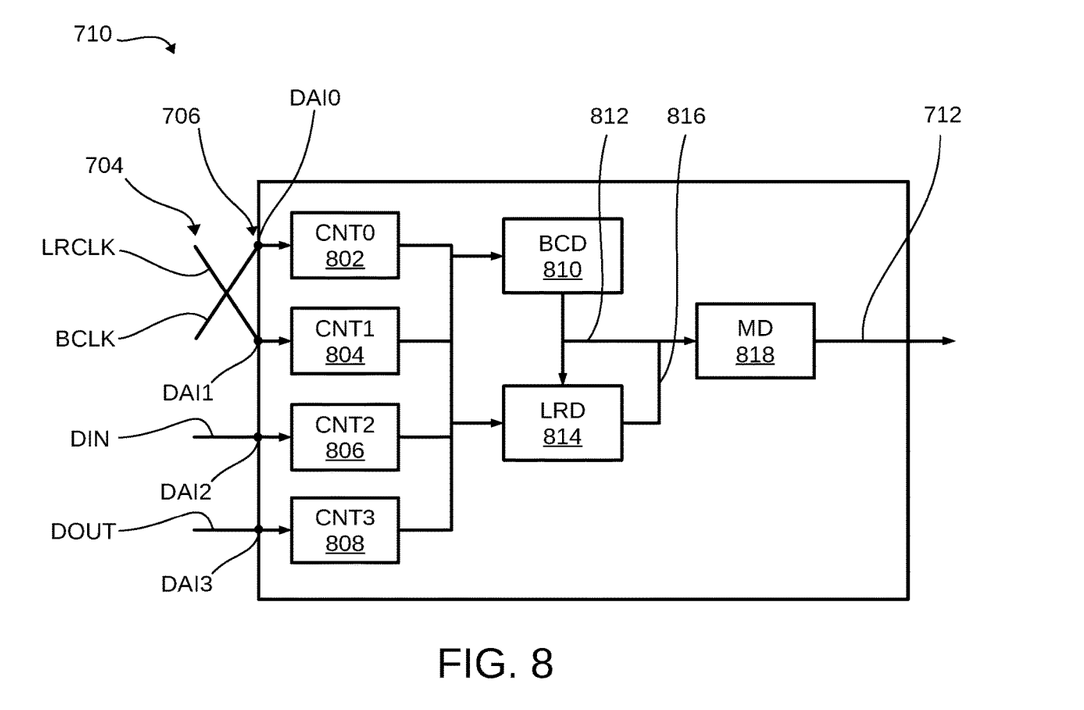
FIG. 8 is a block diagram of the interface location determiner for the selection system of FIG. 7.

Referring now to FIG. 8, therein is shown a block diagram of the interface location determiner 710 for the selection system 700 of FIG. 7. The interface location determiner 710 can include the audio interface pins 706 in a fixed association relative to components within the interface location determiner 710 such as counters.

Illustratively, by way of example, the audio interface pins 706 can include a first Digital Audio Interface pin (DAI0) coupled to a first counter (CNT0 802), a second Digital Audio Interface pin (DAI1) coupled to a second counter (CNT1 804), a third Digital Audio Interface pin (DAI2) coupled to a third counter (CNT2 806), and a fourth Digital Audio Interface pin (DAI3) coupled to a fourth counter (CNT3 808).

The swappable connections 704 are depicted as coupled to the audio interface pins 706. For descriptive clarity, the swappable connections 704 will be described with regard to an LRCLK, a BCLK, a DIN, and a DOUT which should be understood in light of the I2S Inter-IC Sound standard.

As will be appreciated by those of ordinary skill in the art, LRCLK, BCLK, DIN, and DOUT interface lines are used to aid the descriptive illustration of the selection system 700 as they are commonly understood and used with regard to audio amplifiers. However, unless explicitly claimed, no limitation of claimed scope to an I2S implementation should be implied based on the usage of the labels LRCLK, BCLK, DIN, and DOUT.

For the purposes of this application, the LRCLK should be understood to be a channel sync signal. In I2S, the channel sync signal is analogous to the LRCLK, however it is understood by those of ordinary skill in the art that there are other types of channel sync signals that can be used in other contemplated embodiments, and which are referred to herein by the LRCLK. That is, the LRCLK will be used to refer to a channel sync signal in a TDM mode, even though the channel sync signal of TDM is not a left/right sync signal.

The LRCLK can therefore refer to a word clock line, a word select, a channel sync, or left-right clock. The BCLK can refer to a bit clock while the DIN can refer to a shared data line for multiple channels of data. DOUT can be an output from the audio device 702 of FIG. 7, and can be used to synchronize operational aspects between multiple audio devices 702.

Each channel of data can be multiplexed into sequential data frames within the DIN and each frame of data is synchronized with the LRCLK signal. The LRCLK can be a known multiple of the BCLK. For example, the LRCLK can be 48, 64, 128, or 256 cycles of the BCLK. It is contemplated that the LRCLK could be higher multiples of the BCLK.

The detection method for the interface location determiner 710 is the same as is described for the interface location determiner 110 of FIG. 1, except that the interface location determiner 710 includes a fourth swappable connection 704.

As will be appreciated the second embodiment of the interface location determiner 710 can include the first class of pin associations similar in most respects to that of FIG. 4. In this configuration the DIN will be associated with only one of the audio interface pins 706 while the LRCLK, the BCLK, and the DOUT remain swappable resulting in six permutations or modes that can be encoded by the association of the swappable connections 704 to the audio interface pins 706 in the first class of pin associations.

As will be further appreciated the second embodiment of the interface location determiner 710 can include the second class of pin associations similar in most respects to that of FIG. 5. In this configuration the BCLK can be associated with any of the audio interface pins 706, and the DIN, the LRCLK, and the DOUT will each have one pre-configured association for each different location of the BCLK, resulting in four permutations or mode selections, which can be executed very quickly only by locating the association of the BCLK.

As will be yet further appreciated the second embodiment of the interface location determiner 710 can include the third class of pin associations similar in most respects to that of FIG. 6. In this configuration any of the swappable connections 704 can be associated with any audio interface pins 706 resulting in twenty-four permutations or modes that can be encoded by the association of the swappable connections 704 to the audio interface pins 706 in the first class of pin associations.

The swappable connections 704 are input-output pins and initially, each of the swappable connections 704 would be considered input pins until the pin associations between the swappable connections 704 and the audio interface pins 706 is determined and DOUT would be assigned and connected as an output by way of the latch 726 of FIG. 7.

The counters can first count the digital cycles or pulses of the swappable connections 704. Illustratively, the CNT0 802 can count the BCLK cycles, the CNT1 804 can count the LRCLK cycles, the CNT2 806 can count the DIN cycles, and the CNT3 808 can count the DOUT cycles, for example.

The output count of the counters can be input into a BCLK determiner 810. The BCLK determiner 810 can function in multiple different ways. One contemplated method can include identifying the swappable connection 704 with the highest count or highest frequency. Another contemplated method can include identifying the swappable connection 704 with the highest frequency that is also over a minimum BCLK threshold. Yet a further contemplated embodiment can include identifying the swappable connection 704 with the highest frequency and that matches a known BCLK frequency.

It is further contemplated that the BCLK determiner 810 can implement the largest count determination along with the minimum BCLK threshold and along with the BCLK frequency match in order to qualify and determine which of the swappable connections 704 corresponds to the BCLK. Once one of the swappable connections 704 is found to have a highest frequency, be above a minimum BCLK threshold, match a known BCLK frequency, or a combination thereof, the BCLK determiner 810 can output a qualified BCLK line 812.

The qualified BCLK line 812 can indicate which of the swappable connections 704 correspond to the BCLK and which of the audio interface pins 706 is connected to the BCLK.

DOUT can either be detected by the lack of any switching activity utilizing the components of the BCLK determiner 810 or can include additional circuitry and logic that would identify the lack of count on the DOUT. Further, the DOUT can be associated based on the location of the BCLK pin as is described with regard to the second class of pin associations or based on the location of the DIN pin as is described with regard to the first class of pin associations.

The output of the counters along with the qualified BCLK line 812 can be input into an LRCLK determiner 814.

Because the BCLK is known via the qualified BCLK line 812, the LRCLK determiner 814 can compare the other three swappable connections 704 to the qualified BCLK line 812. The cycle length of the other three swappable connections 704 can be compared with the BCLK in order to determine which of the remaining three swappable connections 704 is the LRCLK.

When the length of one cycle from one of the remaining three swappable connections 704 is determined to be a predefined multiple of the BCLK, the LRCLK determiner 814 will output a qualified LRCLK line 816 identifying which of the swappable connections 704 is the LRCLK and which of the audio interface pins 706 is connected to the LRCLK.

The lengths of the remaining three swappable connections 704 can be measured by the BCLK and the result compared to known multiples stored in registers. For example, if the LRCLK determiner 814 found one of the swappable connections 704 to have a cycle with a length of 256 BCLK cycles, the LRCLK determiner 814 would compare the length with registers containing 48, 64, 128, and 256, for example. Since the length of the swappable connection 704 matches with one of the registers, the LRCLK determiner 814 can qualify the LRCLK and output the qualified LRCLK line 816.

The DOUT can be determined next, either within the interface location determiner 710 or within the LRCLK determiner 814 by identifying the swappable connections 704 with no digital cycles. The interface location determiner 710 can, by process of elimination, determine that the remaining swappable connections 704 corresponds to the DIN and which of the audio interface pins 706 the DIN is connected to. It is contemplated that the DIN could also be qualified since DIN data is clocked in by BCLK, its frequency is never more than half that of BCLK.

The length of the DIN line could be compared to the BCLK to ensure the DIN is no more than half the frequency of the BCLK and thereby qualify the DIN. It is contemplated that the swappable connections 704 can be qualified based on multiple readings to increase the robustness of identification as will be discussed with regard to FIG. 6.

The qualified LRCLK line 816 and the qualified BCLK line 812 can be received by a mode determiner 818. The mode determiner 818 can correlate the association of the swappable connections 704 relative to the audio interface pins 706 with a mode for operating the selection system 700.

The mode determiner 818 can utilize a lookup table containing associations of the swappable connections 704 relative to the audio interface pins 706 correlated to modes, or utilize digital logic. The output of the mode determiner 818 is the mode selection 712. As a further output from the interface location determiner 710, or the mode determiner 818 itself, is the association of the DOUT swappable connection 704 relative to the audio interface pins 706, which can be used by the latch 726 to communicatively couple the DOUT swappable connection 704 to the inter-chip communication bus 724 of FIG. 7.

Figure 9:
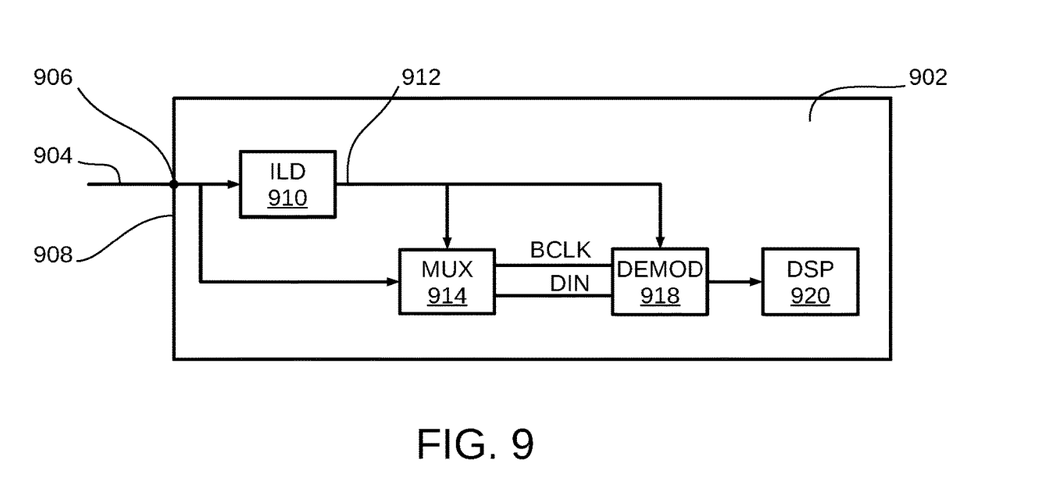
FIG. 9 is a block diagram of the selection system in a third embodiment.

Referring now to FIG. 9, therein is shown a block diagram of the selection system 900 in a third embodiment. The selection system 900 can include an audio device 902. The audio device 902 of the present embodiment can be a pulse density modulated (PDM) audio device, such as is commonly found in digital microphones.

The audio device 902 can include swappable connections 904. The swappable connections 904 can be digital communication lines, including a DIN and a BCLK. The swappable connections 904 can be physically coupled to audio interface pins 906.

The audio interface pins 906 can be in a fixed association relative to the audio device 902 and can be implemented as interconnect terminals such as ball bonds, exposed leads or traces formed on the audio device 902 and exposed from an external surface 908, thereof. The audio device 902 can include an interface location determiner 910. The interface location determiner 910 can determine which of the audio interface pins 906 are associated with which specific swappable connections 904.

The interface location determiner 910 can include a mode selection 912 as an output. It is additionally contemplated that the interface location determiner 910 can output a pin association identifying which of the swappable connections 904 are correlated with which audio interface pins 906.

The interface location determiner 910 can be coupled to a multiplexer 914. The multiplexer 914 can include the swappable connections 904 and the mode selection 912 as inputs. The multiplexer 914 can output the DIN and the BCLK in a fixed association in relation to a digital input component, such as demodulator 918, coupled thereto. It is contemplated that the digital input component can alternatively be implemented as a digital to analog converter.

The multiplexer 914 can be coupled to the output of the interface location determiner 910 and can receive the mode selection 912, the pin associations, or a combination thereof as inputs. The multiplexer 914 can latch the demodulator 918 with the audio interface pin 906 associated with DIN to a first input of the demodulator 918 and the audio interface pins 906 associated with the BCLK to a second input of the demodulator 918.

It is contemplated that the multiplexer 914 can use the pin association provided by the interface location determiner 910 to provide the DIN and BCLK to specific and fixed input locations of the demodulator 918. Alternatively, it is contemplated that the multiplexer 914 could look up the pin associations between the audio interface pins 906, the DIN, and the BCLK based on the mode selection 912, since each mode can correspond to an exact association of the swappable connections 904 with the audio interface pins 906.

The swappable connections 904 are input-output pins and initially, each of the swappable connections 904 would be considered input pins until the pin associations between the swappable connections 904 and the audio interface pins 906 is determined and DIN would be assigned and connected as an output by way of the multiplexer 914. The demodulator 918 is depicted for illustrating the implementations with a digital mic input, however it is contemplated that the demodulator 918 could be replaced with a digital to analog converter (DAC) for the contemplated embodiment with a PDM input and a DAC output.

The demodulator 918 can be coupled to a digital signal processor 920. The digital signal processor 920 can, for example, measure, filter, or compress digital data from the demodulator 918. As will be appreciated, the swappable connections 904 provides two optional locations of the swappable connections 904, and therefore can encode two modes of operation for the audio device 902. The modes, selectable by way of encoding the swappable connections 904, can direct the operation of the audio device 902 in many ways. For example, the modes could indicate sampling edge settings, filter settings, and noise shaping settings.

Figure 10:
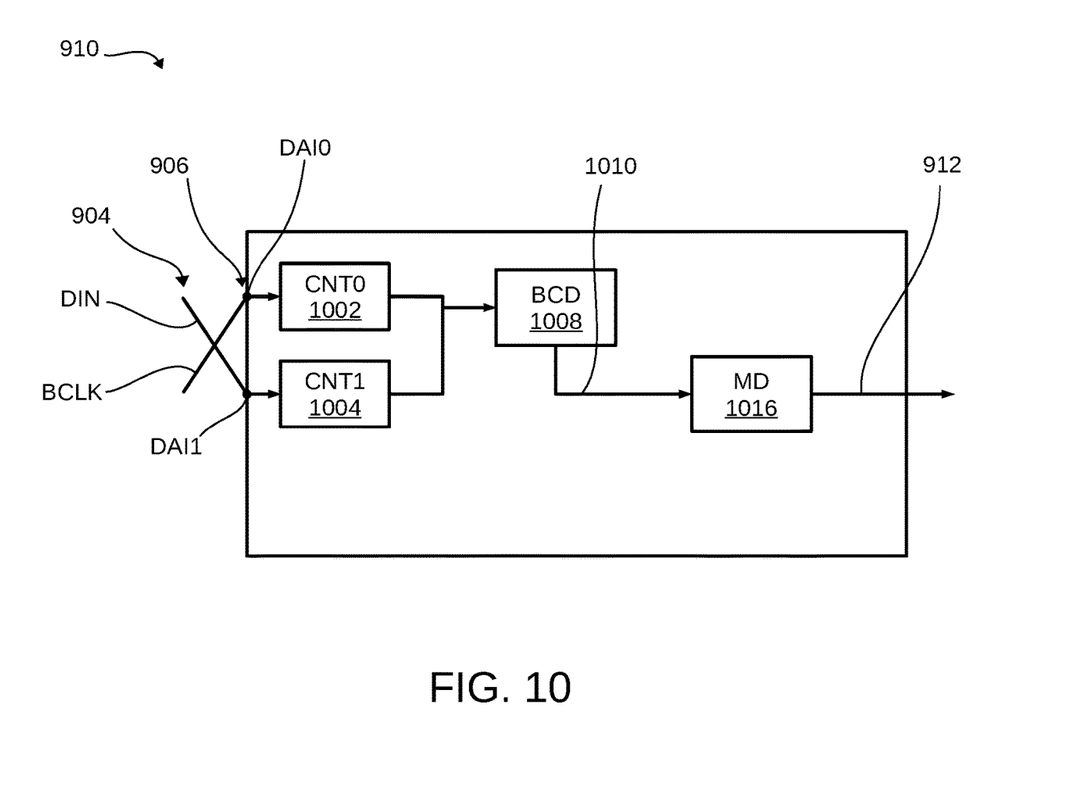
FIG. 10 is a block diagram of the interface location determiner for the selection system of FIG. 9.

Referring now to FIG. 10, therein is shown a block diagram of the interface location determiner 910 for the selection system 900 of FIG. 9. The interface location determiner 910 can include the audio interface pins 906 in a fixed association relative to components within the interface location determiner 910 such as counters.

Illustratively, by way of example, the audio interface pins 906 can include a first Digital Audio Interface pin (DAI0) coupled to a first counter (CNT0 1002) and a second Digital Audio Interface pin (DAI1) coupled to a second counter (CNT1 1004). The swappable connections 904 are depicted as coupled to the audio interface pins 906. For descriptive clarity, the swappable connections 904 will be described with regard to a BCLK, and a DOUT which should be understood in light of the PDM class of microphone components.

As will be appreciated by those of ordinary skill in the art, BCLK and DOUT are used to aid the descriptive illustration of the selection system 900 as they are commonly understood and used with regard to PDM microphones. However, unless explicitly claimed, no limitation of claimed scope to a PDM microphone implementation should be implied based on the usage of the labels BCLK and DOUT.

As depicted, the swappable connections 904 are connected to the audio interface pins 906 in a MODE 1 configuration. Alternatively, the audio interface pins 906 can also be associated to indicate a MODE 0 when the swappable connections 904 are swapped. Specifically, the BCLK is connected to the DAI0, and the DOUT is connected to the DAI1.

The counters can first count the digital cycles or pulses of the swappable connections 904. Illustratively, the CNT0 1002 can count the BCLK cycles while the CNT1 1004 can count the BCLK cycles, for example.

The output count of the counters can be input into a BCLK determiner 1008. The BCLK determiner 1008 can function in multiple different ways. One contemplated method can include identifying the swappable connection 904 with the highest count or highest frequency. Another contemplated method can include identifying the swappable connection 904 with the highest frequency that is also over a minimum BCLK threshold. Yet a further contemplated embodiment can include identifying the swappable connection 904 with the highest frequency and that matches a known BCLK frequency.

It is further contemplated that the BCLK determiner 1008 can implement the largest count determination along with the minimum BCLK threshold and along with the BCLK frequency match in order to qualify and determine which of the swappable connections 904 corresponds to the BCLK. Once one of the swappable connections 904 is found to have a highest frequency, be above a minimum BCLK threshold, match a known BCLK frequency, or a combination thereof, the BCLK determiner 1008 can output a qualified BCLK line 1010.

The qualified BCLK line 1010 can indicate which of the swappable connections 904 correspond to the BCLK and which of the audio interface pins 906 is connected to the BCLK. The output of the counters along with the qualified BCLK line 1010 can be input into a mode determiner 1016.

The interface location determiner 910 can, by process of elimination, determine that the remaining swappable connection 904 corresponds to the DOUT and which of the audio interface pins 906 the DOUT is connected to.

It is contemplated that the DOUT coupled to CNT1 1004 can result in no count as the DOUT can be disconnected from the demodulator 918 of FIG. 9 during an initialization, or mode determination stage. The DOUT, however, can be coupled to the DOUT of additional audio devices 902. When multiple audio devices 902 are used, it is contemplated that all of the audio devices should be initialized at the same time to avoid obscuring the detection of the BCLK.

The qualified BCLK line 1010 can be received by the mode determiner 1016. The mode determiner 1016 can correlate the associations of the swappable connections 904 relative to the audio interface pins 906 with one of two modes for operating the selection system 900.

The mode determiner 1016 can utilize a lookup table containing associations of the swappable connections 904 relative to the audio interface pins 906 correlated to modes, or utilize digital logic. The output of the mode determiner 1016 is the mode selection 912 which can be indicative of MODE 0, or MODE 1.

Figure 11:
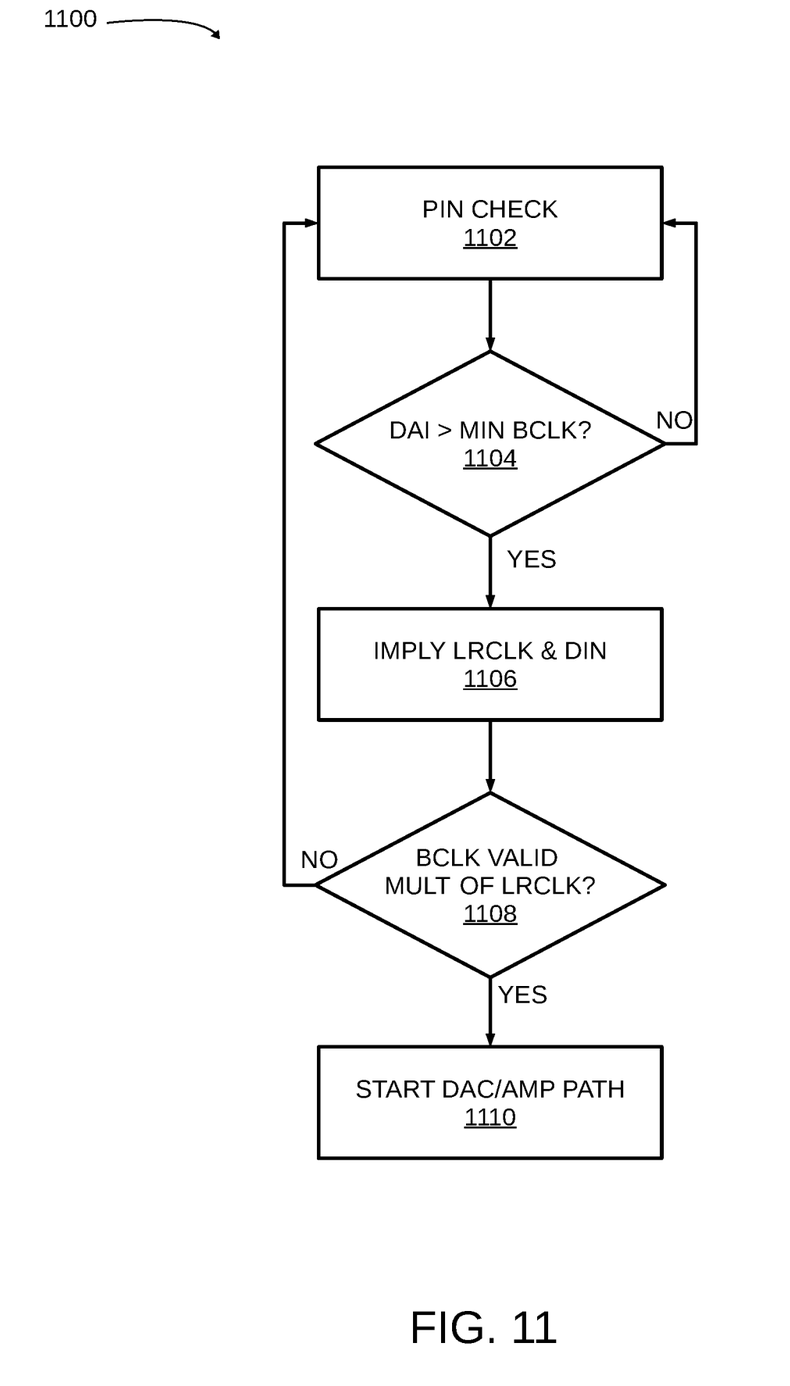
FIG. 11 is a flow chart for a method of operating the selection system of FIG. 1, the selection system of FIG. 7, or the selection system of FIG. 9.

Referring now to FIG. 11, therein is shown a flow chart 1100 for a method of operating the selection system 100 of FIG. 1, the selection system 700 of FIG. 7, or the selection system 900 of FIG. 9. The method provides for the second class of pin associations for the audio device 102 of FIG. 1, the audio device 702 of FIG. 7, or the audio device 902 of FIG. 9. As used with regard to the flow chart 1100, use of the term audio device should be understood to include the audio device 102 of FIG. 1, the audio device 702 of FIG. 7, and the audio device 902 of FIG. 9.

Specifically, the BCLK can be determined and the other swappable connections including LRCLK, DIN, and DOUT can be established based on a pre-defined relationship to the BCLK. The audio device can begin determining which of the swappable connections are associated with which of the audio interface pins by initiating a pin check step 1102.

The pin check step 1102 can utilize counters to count the digital cycles on each of the swappable connections. The counter showing the highest frequency is associated with BLCK. Once the swappable connections having the highest pulse count is determined by the pin check step 1102, the audio device can initiate a threshold determination step 1104.

The threshold determination step 1104 can evaluate the count of the highest swappable connection, as determined by the pin check step 1102 with a BCLK minimum threshold. If the count of the highest swappable connection from the pin check step 1102 falls below the BCLK minimum threshold, the audio device can initiate and run the pin check step 1102 again.

If the count of the highest swappable connection from the pin check step 1102 is above the BCLK minimum threshold, the audio device can initiate an imply swappable connection position step 1106. The imply swappable connection position step 1106 can imply the association, based on a pre-defined association, of the remaining swappable connections with the remaining audio interface pins.

That is, for every audio interface pin, which the BCLK can be detected on, a pre-defined fixed association of the other swappable connections can be implied within the imply swappable connection position step 1106. As will be appreciated, at imply swappable connection position step 1106, the audio device will have pin associations for each of the BCLK, the LRCLK, the DIN, and the DOUT, with the LRCLK, the DIN, and the DOUT being associated to the audio interface pins solely by the determination of the BCLK with one of the audio interface pins.

The swappable connections therefore have 4 pre-defined associations with the audio interface pins. Once BCLK is determined, the other swappable connection associations will be implied by the pre-defined and pre-determined associations. Similarly, when DOUT is not used, the audio device can have 3 pre-defined associations with the audio interface pins. Once BCLK is determined, the other swappable connection associations will be implied by the pre-defined and pre-determined associations.

The audio device can then execute an LRCLK validity decision step 1108. The LRCLK validity decision step 1108 can evaluate the count of the LRCLK, determined within the pin check step 1102, with the count of the BCLK for a specific multiple between the two counts. Illustratively, the LRCLK validity decision step 1108 could check to ensure the LRCLK count is 48×, 64×, 128×, 256×, or other multiple slower than the BCLK count.

If the LRCLK is not found to have a count that is a valid multiple of the BCLK count, the audio device will return a negative result and the audio device will re-execute the pin check step 1102. If the LRCLK is found to have a count that is a valid multiple of the BCLK count, the audio device will return an affirmative result and the audio device will execute a start path step 1110.

During the start path step 1110, the audio device can couple the BCLK, the LRCLK, and the DAI with the digital to analog converter. Further, during the start path step 1110, the audio device can couple the DOUT to the inter-chip communication bus 724 of FIG. 7.

The audio device can continuously monitor the swappable connections to ensure a valid BCLK, LRCLK, or a combination thereof are qualified. If no qualified BCLK or LRCLK are found, the various components of the audio device, other than the interface location determiner, can be placed in a low-power state.

The interface location determiner can remain in an active state in order to detect valid BCLK and LRCLK. The audio device can enter a low-power state while the interface location determiner attempts to re-qualify the BCLK or LRCLK. Once the interface location determiner determines a mode, the audio device will be powered up and the DIN, BCLK, and LRCLK will be provided to the other components within the audio device. The low-power state is to be understood as an idle, standby, or power down of components within the audio device other than the interface location determiner.

Thus, it has been discovered that the audio amplifier furnishes important and heretofore unknown and unavailable solutions, capabilities, and functional aspects. The resulting configurations are straightforward, cost-effective, uncomplicated, highly versatile, accurate, sensitive, and effective, and can be implemented by adapting known components for ready, efficient, and economical manufacturing, application, and utilization.

While the audio amplifier has been described in conjunction with a specific best mode, it is to be understood that many alternatives, modifications, and variations will be apparent to those skilled in the art in light of the preceding description. Accordingly, it is intended to embrace all such alternatives, modifications, and variations, which fall within the scope of the included claims. All matters set forth herein or shown in the accompanying drawings are to be interpreted in an illustrative and non-limiting sense.

What is claimed is:

1. A mode selection system comprising:
   interface pins coupled to swappable connections, the interface pins and the swappable connections being associated by a physical connection;
   a bit clock determiner coupled to the interface pins, the bit clock determiner configured to identify a bit clock as one of the swappable connections with a highest frequency, and output a first association between the bit clock and a first interface pin;
   a word clock determiner coupled to a bit clock determiner output, the word clock determiner configured to:
   measure cycle lengths of the swappable connections relative to the bit clock,
   compare the cycle lengths of the swappable connections to a pre-defined multiple,
   identify a word clock as one of the swappable connections based on one of the cycle lengths from the swappable connections matching a pre-defined multiple of the bit clock, and
   output a second association between the word clock and a second interface pin;
   a mode determiner coupled to the bit clock determiner output and coupled to a word clock determiner output, the mode determiner configured to identify and output a mode based on the first association of the bit clock to the interface pins and the second association of the word clock to the interface pins; and
   a digital interface coupled to the mode determiner and configured to process data based on the mode identified by the mode determiner.

2. The mode selection system of claim 1 wherein the mode determiner indicates the mode as a digital interface data format including I2S standard mode, a left justified mode, a right justified mode, or a TDM mode.

3. The mode selection system of claim 1 wherein the mode determiner indicates the mode as a channel selection including a selection of one output channel of the digital interface, left, right, mono-mix, or TDM channel.

4. The mode selection system of claim 1 wherein the mode determiner indicates the mode as an amplifier gain, a filtering option, a volume ramping, or a combination thereof.

5. The mode selection system of claim 1 wherein the bit clock determiner is configured to qualify the bit clock by comparing the highest frequency of the swappable connections to known frequencies for the bit clock.

6. The mode selection system of claim 1 wherein the bit clock determiner is configured to qualify the bit clock by comparing the highest frequency of the swappable connections to a minimum threshold.

7. The mode selection system of claim 1 wherein the mode selection system is a digital to analog converter with a pulse code modulated input or is an audio amplifier with the swappable connections being digital.

8. The mode selection system of claim 1 wherein the word clock determiner is configured to output the second association between the word clock and the second interface pin based on one of the cycle lengths from the swappable connections being 32 times, 48 times, 128 times, or 256 times a bit clock length.

9. The mode selection system of claim 1 wherein the mode selection system is configured to be in a low-power state until the bit clock is qualified, the word clock is qualified, or a combination thereof.

10. The mode selection system of claim 1 wherein a data input is in a fixed association with regard to the interface pins and with the bit clock and the word clock swappable for providing two mode selections.

11. The mode selection system of claim 1 wherein:
    the swappable connections further include a data output and a data input in a fixed association with regard to the interface pins; and
    the bit clock, the word clock, and the data output swappable for providing six mode selections.

12. The mode selection system of claim 1 wherein the swappable connections further includes a data output, and the mode selection system configured to determine a third association of the data output relative to the interface pins by detecting an absence of signal on the data output.

13. The mode selection system of claim 12 further comprising a latch coupled to the mode determiner, the latch configured to couple a third interface pin associated with the data output to an inter-chip communication bus.

14. A mode selection system comprising:
    interface pins coupled to swappable connections, the swappable connections including a bit clock, a word clock, and a data input, the interface pins and the swappable connections being associated by a physical connection, the word clock and the data input having a pre-defined association to the interface pins based on a single interface pin connected and associated with the bit clock;
    a bit clock determiner coupled to the interface pins, the bit clock determiner configured to identify the bit clock as one of the swappable connections with a highest frequency, and output an association between the bit clock and the single interface pin;
    a mode determiner coupled to a bit clock determiner output, the mode determiner configured to identify and output a mode based on the association of the bit clock to the single interface pin; and
    a digital interface coupled to the mode determiner and configured to process data of the data input based on the mode identified by the mode determiner.

15. The mode selection system of claim 14 wherein the interface pins associated with the word clock and the data input are pre-determined based on the association of the bit clock relative to the interface pins, and providing three mode selections.

16. The mode selection system of claim 14 wherein the interface pins further includes a data output, the interface pins associated with the word clock, the data input, and the data output are pre-determined based on the association of the bit clock relative to the interface pins, and providing four mode selections.

17. The mode selection system of claim 14 further comprising a digital to analog converter coupled to the mode determiner and the digital interface.

18. The mode selection system of claim 14 further comprising an amplifier coupled to the mode determiner for amplifying the data carried on the data input.

19. A mode selection system comprising:
    interface pins coupled to swappable connections, the swappable connections including a bit clock, and a data input, the interface pins and the swappable connections being associated by a physical connection;
    a bit clock determiner coupled to the interface pins, the bit clock determiner configured to identify the bit clock as one of the swappable connections with a highest frequency, and output an association between the bit clock and a first interface pin;
    a mode determiner coupled to a bit clock determiner output, the mode determiner configured to identify and output a mode based on the association of the bit clock to the first interface pin; and a digital input component coupled to a mode determiner output, the digital input component being a digital to analog converter or a demodulator.

20. The mode selection system of claim 19 further comprising a multiplexer coupled to the mode determiner output, the multiplexer configured to couple a second interface pin associated with the data input to a first input of the digital input component and configured to couple the first interface pin associated with the bit clock to a second input of the digital input component.

21. The mode selection system of claim 19 wherein the mode determiner is configured to indicate the mode as a sampling edge setting, a filter setting, a noise shaping setting, or a combination thereof.

22. A method of operating a mode selection system comprising:

receiving inputs on interface pins from swappable connections, the swappable connections including a bit clock, a word clock, and a data input;

determining a first association between the interface pins and the bit clock based on identifying the swappable connection having a highest frequency; and implying a second association of the word clock and a third association of the data input in relation to the interface pins based on the first association of the bit clock.

23. The method of claim 22 further comprising validating the bit clock by comparing the bit clock to a minimum bit clock threshold, comparing the bit clock to a known bit clock frequency, or a combination thereof.

24. The method of claim 22 further comprising validating the word clock based on comparing a length of the word clock, measured by the bit clock, with known multiples of the bit clock.

* * * * *